United States Patent
Choi et al.

(10) Patent No.: US 10,320,037 B2
(45) Date of Patent: Jun. 11, 2019

(54) OVERCHARGE SAFETY DEVICE

(71) Applicants: HYUNDAI MOTOR COMPANY, Seoul (KR); KIA MOTORS CORPORATION, Seoul (KR)

(72) Inventors: Sung Min Choi, Gyeongju-si (KR); Hong Seok Min, Yongin-si (KR); Oh Min Kwon, Busan (KR); Ik Kyu Kim, Gwangmyeong-si (KR); Seung Ho Ahn, Hanam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 92 days.

(21) Appl. No.: 15/614,253

(22) Filed: Jun. 5, 2017

(65) Prior Publication Data
US 2018/0159185 A1    Jun. 7, 2018

(30) Foreign Application Priority Data
Dec. 5, 2016    (KR) ........................ 10-2016-0164175

(51) Int. Cl.
| | | |
|---|---|---|
| *H02J 7/00* | (2006.01) | |
| *H02J 7/14* | (2006.01) | |
| *H01M 10/44* | (2006.01) | |
| *H01M 2/34* | (2006.01) | |
| *H01M 2/02* | (2006.01) | |
| *H01M 2/20* | (2006.01) | |
| *G01R 31/378* | (2019.01) | |

(52) U.S. Cl.
CPC ....... *H01M 10/445* (2013.01); *H01M 2/0275* (2013.01); *H01M 2/202* (2013.01); *H01M 2/345* (2013.01); *G01R 31/378* (2019.01); *H01M 2200/20* (2013.01)

(58) Field of Classification Search
USPC ....... 320/147, 134, 135, 150, 106, 107, 116, 320/124, 136, 137, 138, 154, 109, 112
See application file for complete search history.

(56) References Cited

U.S. PATENT DOCUMENTS

| | | | | |
|---|---|---|---|---|
| 7,508,171 | B2 * | 3/2009 | Carrier | B25F 5/00 320/135 |
| 7,714,542 | B2 * | 5/2010 | Lee | H02J 7/0042 320/134 |
| 2004/0096732 | A1 | 5/2004 | Shin et al. | |
| 2006/0267545 | A1 * | 11/2006 | Lee | H01M 2/1061 320/106 |
| 2008/0241671 | A1 * | 10/2008 | Cherng | H01M 2/021 429/163 |

(Continued)

FOREIGN PATENT DOCUMENTS

| | | |
|---|---|---|
| KR | 100457626 B1 | 11/2004 |
| KR | 101370264 B1 | 3/2014 |
| KR | 101664590 B1 | 10/2016 |

*Primary Examiner* — Alexis B Pacheco
(74) *Attorney, Agent, or Firm* — Lempia Summerfield Katz LLC (57) ABSTRACT

An overcharge safety device includes a switch electrically connecting a lead tap of a battery cell with a bus bar, and includes a guide member connected with the switch and movable as a pouch of the battery cell swells. As the pouch of the battery cell swells, the guide member moves toward the bus bar to disconnect the switch from the lead tap.

16 Claims, 7 Drawing Sheets

(56) References Cited

U.S. PATENT DOCUMENTS

| | | | |
|---|---|---|---|
| 2011/0039147 A1* | 2/2011 | Cheon | H01M 2/206 |
| | | | 429/159 |
| 2013/0280578 A1 | 10/2013 | Yang et al. | |
| 2015/0162593 A1* | 6/2015 | Lee | H04W 88/08 |
| | | | 429/150 |
| 2016/0093852 A1* | 3/2016 | DeKeuster | H01M 2/1077 |
| | | | 320/107 |
| 2016/0149197 A1* | 5/2016 | Kang | H01M 2/345 |
| | | | 429/61 |
| 2017/0077487 A1* | 3/2017 | Coakley | H01M 2/202 |

* cited by examiner

OVERCHARGE SAFETY DEVICE

CROSS-REFERENCE TO RELATED APPLICATION

This application is based on and claims the benefit of priority to Korean Patent Application No. 10-2016-0164175, filed on Dec. 5, 2016, in the Korean Intellectual Property Office, the disclosure of which is incorporated herein in its entirety by reference.

TECHNICAL FIELD

The present disclosure relates to an overcharge safety device, and more particularly, to an overcharge safety device capable of cutting off a current.

BACKGROUND

As generally known to those having ordinary skill in the art, a battery cell, which is used to supply electrical energy, stores the electrical energy therein or discharges the electrical energy therefrom during the charging or discharging of the battery cell.

When the battery cell is over-discharged, the lifespan and the durability of the battery cell may be reduced due to an energy consumption characteristic. When the battery cell is overcharged, a risk to safety may be caused due to an energy accumulation characteristic.

When the battery cell is overcharged, gas may be generated and a temperature may be increased in the battery cell. Accordingly, the battery cell may be swollen and exploded, which is referred to as a swelling phenomenon.

Accordingly, a safety circuit against the overcharge is provided in the battery cell such that the battery cell is charged up until a point at which the battery cell is ignited or exploded. Accordingly, fail-safe operation may be ensured for the safety of a customer.

Meanwhile, a pouch type battery cell may include an electrode assembly, a thin-plate pouch which encloses the electrode assembly, and a lead tap connected with the electrode assembly.

In addition, a plurality of battery cells may be connected with bus bars to make battery modules.

Such a battery module may include a current interrupt device (CID), a kind of safety circuit. The CID disconnects the electrode assembly from the lead tap to interrupt the flow of the current when the battery cell is overcharged and when the pouch swells.

SUMMARY

The present disclosure has been made to solve the above-mentioned problems occurring in the prior art while advantages achieved by the prior art are maintained intact.

An aspect of the present disclosure provides an overcharge safety device capable of cutting off a current by using the expansion pressure of gas produced in a battery cell to prevent the battery cell from being ignited or exploded when the battery cell is overcharged. The disclosed overcharge device is capable of disconnecting a lead tap from a bus bar by using expansion pressure of gas produced in a battery cell to cut off a current, thereby stopping charging of the battery cell when the battery cell is overcharged.

The technical problems to be solved by the present disclosure are not limited to the aforementioned problems, and any other technical problems not mentioned herein will be clearly understood from the following description by those having ordinary skill in the art to which the present disclosure pertains.

According to an aspect of the present disclosure, an overcharge safety device may include a switch electrically connecting a lead tap of a battery cell with a bus bar, and a guide member connected with the switch and movable as a pouch of the battery cell swells. As the pouch of the battery cell swells, the guide member may move toward the bus bar such that the switch is disconnected from the lead tap.

The guide member may have a first end portion approaching the pouch of the battery cell or making contact with the pouch of the battery cell. and the guide member may have a second end portion fixed to the switch.

The switch may include a switch body including a conductive material and a first bonding part and a second bonding part extending from the switch body.

The first bonding part and the second bonding part may extend in a direction perpendicular to the switch body.

The first bonding part and the second bonding part may be spaced apart from each other in a lengthwise direction of the switch body.

The overcharge safety device may further include a housing, which receives the switch and a portion of the guide member.

The housing may have a first opening into which the lead tap is inserted and a second opening into which a connection part of the bus bar is inserted.

The portion of the guide member may be inserted into the housing while passing through the housing.

A contact member may be mounted at the first end portion of the guide member.

The contact member may be inclined.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, an embodiment of the present disclosure is described with reference to accompanying drawings. The size of each element and the thickness of a line, which are illustrated in accompanying drawings, may be exaggerated for the purpose of convenience or clarity, and do not reflect an actual size. In addition, the terms employed for the description of the present disclosure are defined based on functions of relevant elements in the present disclosure. Accordingly, the terms may be varied with the intent and the custom of a user and an operator. The terms are defined based on the disclosed concept throughout the specification.

Figure 1:
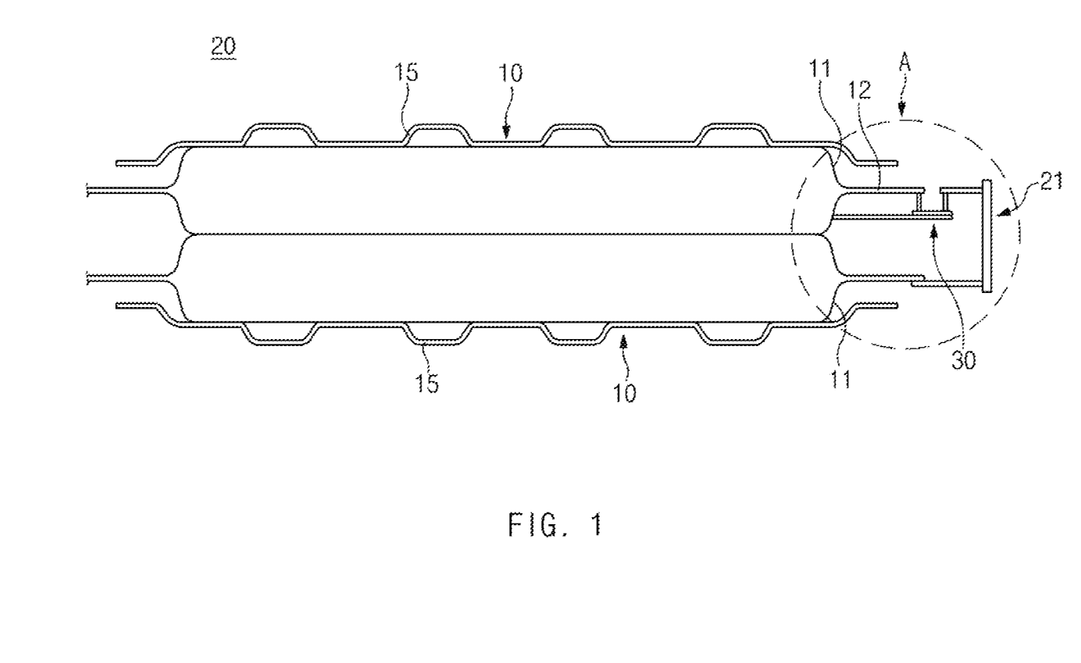
FIG. 1 is a plan view illustrating the structure in which an overcharge safety device is mounted in a battery module, according to an embodiment of the present disclosure.
Figure 2:
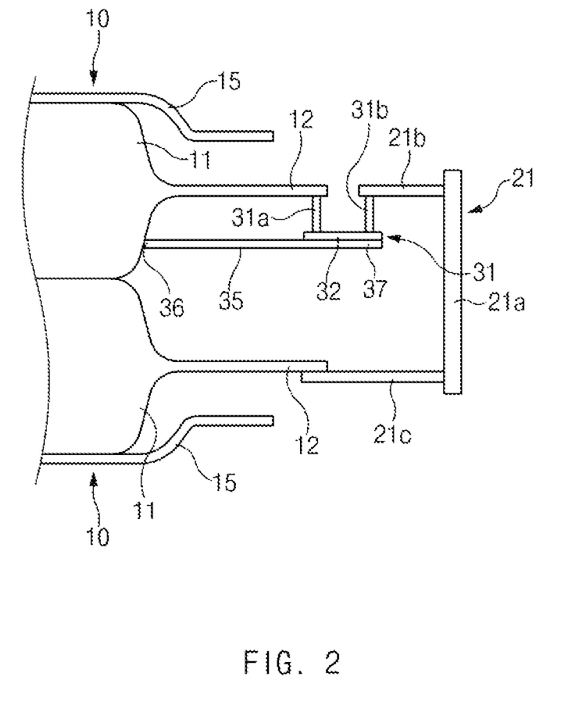
FIG. 2 is an enlarged view illustrating element A of FIG. 1, in which a lead tap is connected with a bus bar through the overcharge safety device.
Figure 3:
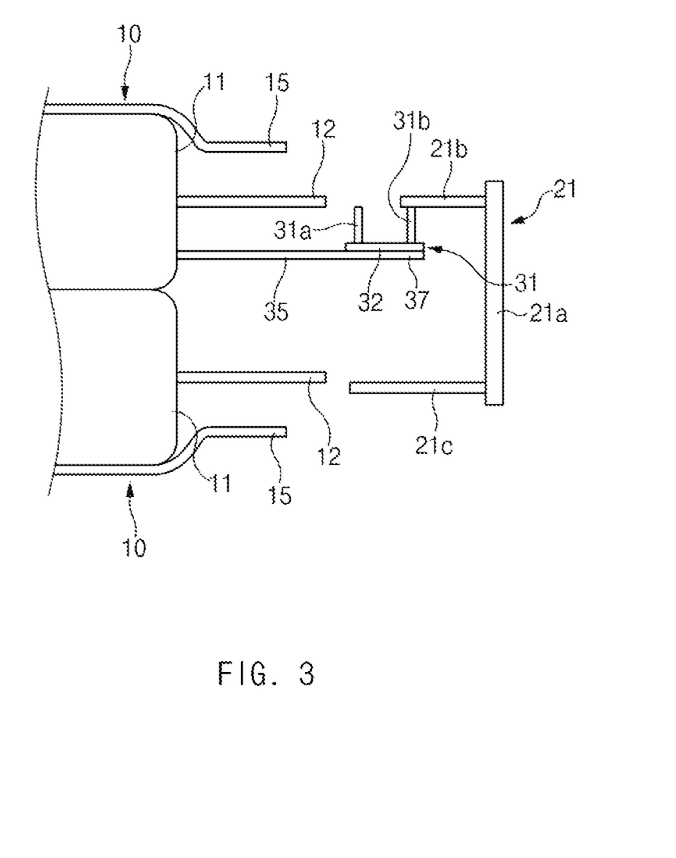
FIG. 3 is a view illustrating the lead tap disconnected from the bus bar by the overcharge safety device of FIG. 2.

Referring to FIGS. 1-3, a battery module 20 may have two or more battery cells 10 electrically connected with at least one bus bar 21.

The bus bar 21 may have a strip-shaped bar body 21a, and the strip-shaped bar body 21a may include two connection parts 21b and 21c extending toward the two battery cells 10, respectively. As the two connection parts 21b and 21c of the bus bar 21 are independently connected with the two battery cells 10, which are adjacent to each other, respectively, the two battery cells 10 may be electrically connected with each other.

Each battery cell 10 may have a pouch 11, and the pouch 11 may sealingly enclose an electrode assembly and an electrolyte.

The electrode assembly of each battery cell 10 may be connected with a lead tap 12, and the lead tap 12 may protrude out of the pouch 11.

Each battery cell 10 may be provided on one surface thereof with a heat sink plate 15. The heat of the battery cell 10 may be effectively radiated by the heat sink plate 15.

The pouch 11 may have a multi-layer structure to ensure an excellent thermal fusion property, stiffness (which is used to maintain a shape of the pouch 11 and to protect the electrode assembly), and an insulating property. For example, the pouch 11 may have a multi-layer structure including a first layer located at the innermost position and facing the electrode assembly, a second layer located at the outermost position and directly exposed to an external environment, and a third layer interposed between the first layer and the second layer. The first layer may be formed of a material, such as polypropylene (PP), which exhibits corrosion resistance, an insulating property, and a thermal fusion property with respect to the electrolyte. The second layer may be formed of a material, such as polyethylene terephthalate (PET), which exhibits stiffness for maintaining a shape and an insulating property. The third layer may be formed of a metallic material such as aluminum (Al).

Referring to FIG. 2, according to various embodiments of the present disclosure, an overcharge safety device 30 may be interposed between the lead tap 12 of the battery cell 10 and the bus bar 21. The overcharge device 30 may be configured to disconnect the lead tap 12 from the bus bar 21 due to a swollen or expanded pouch when the pouch 11 expands or swells by expansion pressure of gas produced by the side reaction of the electrolyte.

The overcharge safety device 30 may include a switch 31, which electrically connects or disconnects the lead tap 12 of at least one battery cell 10 with or from the bus bar 21, and may include a guide member 35, which is connected with the switch 31 and is movable as the pouch 11 swells.

The switch 31 may include a switch body 32, which is formed of a conductive material such as metal, and may include a first bonding part 31a and a second bonding part 31b extending from the switch body 32.

The switch body 32 may have a thin plate structure with a predetermined length. The lead tap 12 may be spaced apart from the connection part 21b of the bus bar 21 by the length of the switch body 32.

The first bonding part 31a and the second bonding part 31b may extend in a direction perpendicular to the switch body 32. The first bonding part 31a and the second bonding part 31b may be spaced apart from each other in a lengthwise direction of the switch body 32.

The first bonding part 31a and the second bonding part 31b may be formed of conductive materials. The first bonding part 31a may be bonded to the lead tap 12 by a soldering method or other suitable manner. The second bonding part 31b may be bonded to the connection part 21b of the bus bar 21 by a soldering method or other suitable manner. Accordingly, the switch 31 may electrically connect the lead tap 12 with the bus bar 21 through the first bonding part 31a and the second bonding part 31b.

The first bonding part 31a and the second bonding part 31b may have thicknesses that are thinner than that of the switch body 32. Accordingly, when the overcharge occurs, the first bonding part 31a and the second bonding part 31b may be easily broken by the expansion pressure.

The guide member 35 may be formed in the shape of a strip extending in a lengthwise direction between the battery cell 10 and the bus bar 21. The guide member 35 may be configured to move toward the bus bar 21 as the pouch 11 swells by the expansion pressure of gas produced in the battery cell 10 when the battery cell 10 is overcharged.

The guide member 35 may have a first end portion 36 approaching or making contact with one surface of the pouch 11 and a second end portion 37 fixed to the switch body 32 of the switch 31.

As illustrated in FIG. 3, the pouch 11 expands or swells by the expansion pressure of gas produced in the pouch 11 when the battery cell 10 is overcharged. In this case, the guide member 35 may move toward the bus bar 21 by the expansion pressure of the gas produced in the pouch 11. Accordingly, the switch 31 fixed to the second end portion 37 of the guide member 35 moves toward the bus bar 21, such that the switch 31 and the lead tap 12 are disconnected from each other. Therefore, the current may be cut off and thus charging may be stopped.

According to an embodiment, the first end portion 36 of the guide member 35 is spaced apart from the side surface of the pouch 11 by a slight distance.

According to another embodiment, the first end portion 36 of the guide member 35 may make contact with the side surface of the pouch 11. Accordingly, when the pouch 11 swells, the guide member 35 may rapidly and firmly move toward the bus bar 21 and thus the lead tap 12 may be firmly disconnected from the first bonding part 31a of the switch 31.

Figure 4:
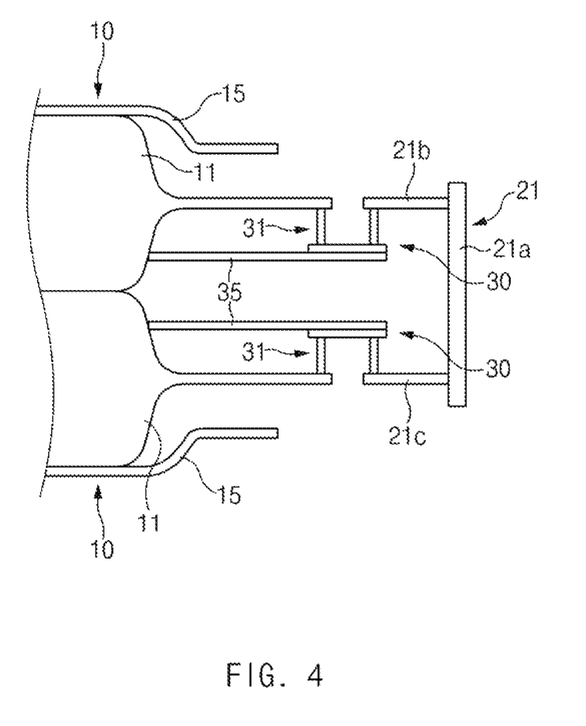
FIG. 4 is a plan view illustrating the structure in which an overcharge safety device is mounted in a battery module, according to another embodiment of the present disclosure.

The present disclosure has been described with reference to FIGS. 1-3. The overcharge safety device 30 is interposed between the bus bar 21 and any one of battery cells 10, which form the battery module 20. The overcharge safety device 30 may be individually interposed between bus bar 21 and the lead tap 12 of each of the battery cells 10, which form the battery module 20 according to the present disclosure as illustrated in FIG. 4.

Figure 5:
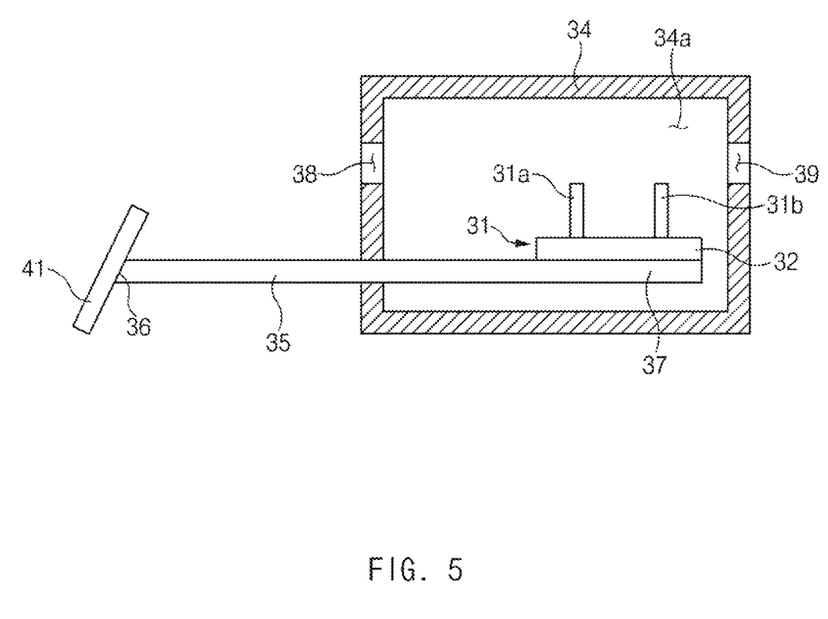
FIG. 5 is a view illustrating an overcharge safety device, according to an embodiment of the present disclosure.
Figure 6:
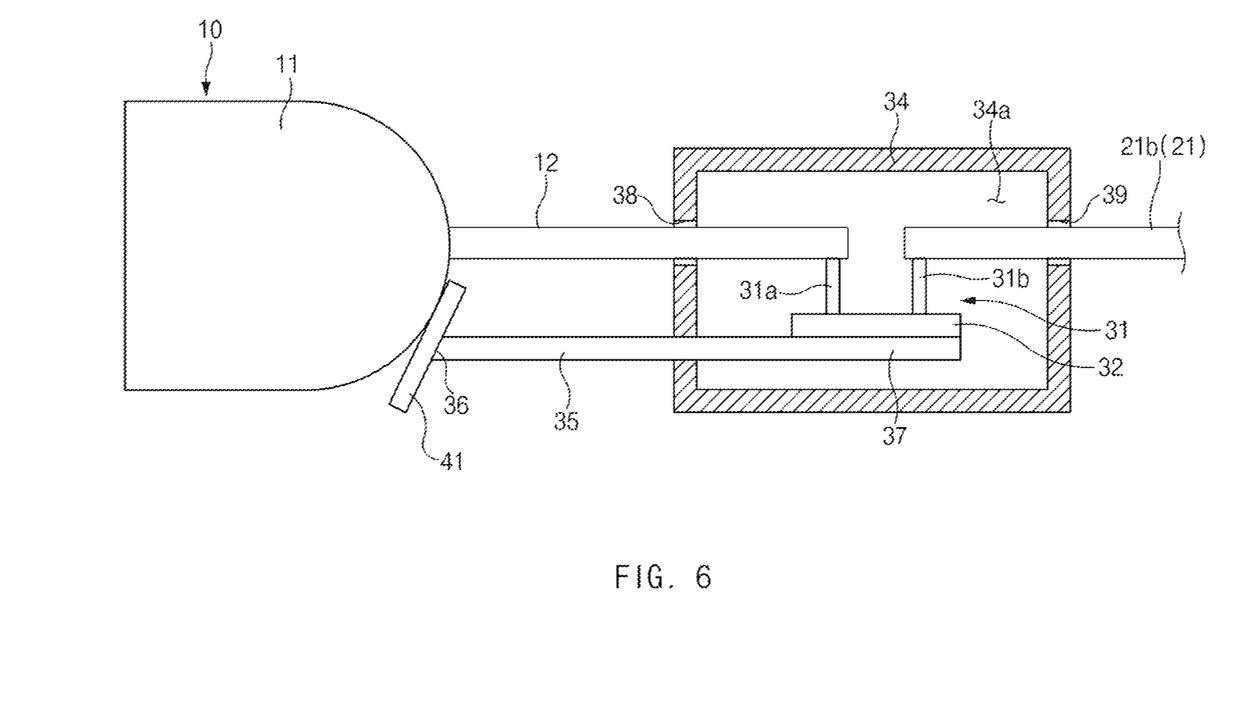
FIG. 6 is a view illustrating the lead tap of the battery cell, which is connected with the bus bar through the overcharge safety device of FIG. 5.
Figure 7:
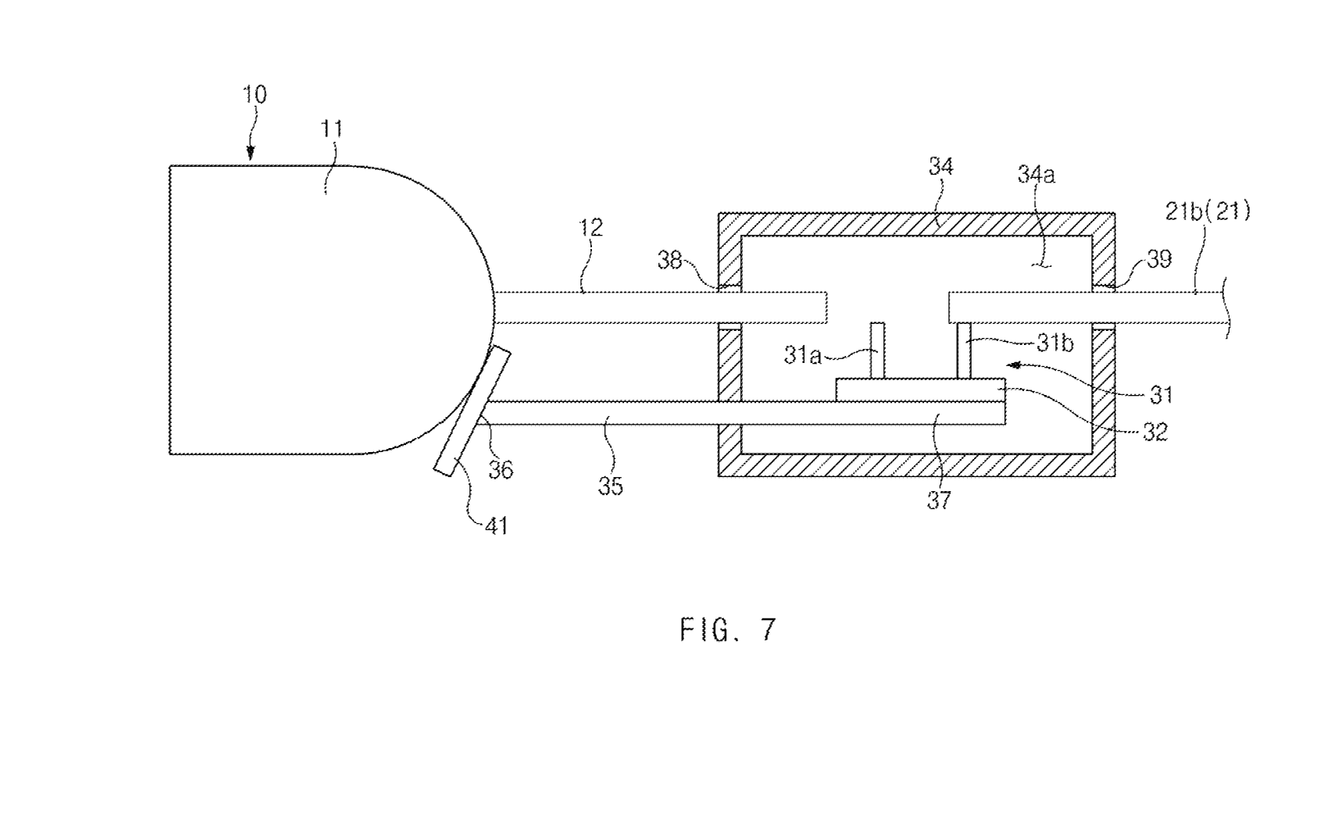
FIG. 7 is a view illustrating the lead tap of the battery cell, which is disconnected from the bus bar by the overcharge safety device of FIG. 5.

FIGS. 5-7 are views illustrating the overcharge safety device 30, according to an embodiment of the present disclosure.

Referring to FIG. 5, according to an embodiment of the present disclosure, the overcharge safety device 30 may further include a housing 34, which receives the switch 31 and a portion of the guide member 35.

The housing 34 may have a receiving space 34a in which the switch 31 and a portion of the guide member 35, which is adjacent to the second end portion 37, may be received. The housing 34 may protect the switch 31 and the portion of the guide member 35 from an external shock.

The housing 34 may be formed with a first opening 38 in one side of the housing 34 into which the lead tap 12 is inserted. and the housing 34 may be formed with a second opening 39 in an opposite side of the housing 34 into which the connection part 21b of the bus bar 21 is inserted.

As illustrated in FIG. 6, as the lead cap 12 is inserted into the first opening 38 of the housing 34, the lead cap 12 may be bonded to the first bonding part 31a of the switch 31. As the connection part 21b of the bus bar 21 is inserted into the second opening 39 of the housing 34, the connection part 21b of the bus bar 21 may be bonded to the second bonding part 31b of the switch 31.

The guide member 35 may be inserted into the housing 34 while passing through the housing 34, and may be coupled to the housing 34. The second end portion 37 of the guide member 35 may be fixed to the switch body 32 of the switch 31 in the receiving space 34a of the housing 34. Accordingly, as the guide member 35 moves, the housing 34 moves together with the guide member 35.

A contact member 41 may be mounted at the first end portion 36 of the guide member 35 and may make contact with the side surface of the battery cell 10. The expansion pressure of gas produced in the pouch 11 is rapidly transmitted to the guide member 35 through the contact member 41. Accordingly, the guide member 35 may rapidly and stably move toward the bus bar 21.

The contact member 41 may be arranged in such a manner that the contact member 41 is inclined corresponding to the shape of the pouch 11, which is formed before the pouch 11 swells. The expansion pressure of gas produced in the pouch 11 may be rapidly and effectively transmitted to the guide member 35 due to the inclination structure of the contact member 41. Accordingly, the guide member 35 may rapidly and stably move toward the bus bar 21.

As illustrated in FIG. 7, the pouch 11 expands or swells due to the expansion pressure of gas produced in the pouch 11 when the battery cell 10 is overcharged. In this case, the expansion pressure of the gas produced in the pouch 11 is stably transmitted to the guide member 35 through the contact member 41. Therefore, as the guide member 35 moves toward the bus bar 21, the housing 34 and the switch 31 move toward the bus bar 21 together. The first bonding part 31a of the switch 31 is disconnected from the lead cap 12 to cut off the current and thus to stop charging the battery cell.

As described above, according to the present disclosure, when the battery cell is overcharged, the lead tap is disconnected from the bus bar by using expansion pressure of gas produced in the battery cell such that the current is cut off and thus charging the battery cell is stopped. Accordingly, the battery cell may be prevented from being ignited or exploded.

Hereinabove, although the present disclosure has been described with reference to embodiments and the accompanying drawings, the present disclosure is not limited thereto, but may be variously modified and altered by those having ordinary skill in the art to which the present disclosure pertains without departing from the spirit and scope of the present disclosure claimed in the following claims.

What is claimed is:

1. An overcharge safety device comprising:
a switch electrically connecting a lead tap of a battery cell with a bus bar; and
a guide member connected with the switch and movable as a pouch of the battery cell swells,
wherein, as the pouch of the battery cell swells, the guide member moves toward the bus bar such that the switch is disconnected from the lead tap,
wherein the switch includes
a switch body including a conductive material, and
a first bonding part and a second bonding part extending from the switch body, and
wherein the first bonding part and the second bonding part extend in a direction perpendicular to the switch body.

2. The overcharge safety device of claim 1, wherein the guide member includes:
a first end portion approaching the pouch of the battery cell; and
a second end portion fixed to the switch.

3. The overcharge safety device of claim 1, wherein the guide member includes:
a first end portion making contact with the pouch of the battery cell; and
a second end portion fixed to the switch.

4. The overcharge safety device of claim 1, wherein the first bonding part and the second bonding part are spaced apart from each other in a lengthwise direction of the switch body.

5. The overcharge safety device of claim 1, further comprising:
a housing which receives the switch and a portion of the guide member.

6. The overcharge safety device of claim 5, wherein the housing includes:
a first opening into which the lead tap is inserted; and
a second opening into which a connection part of the bus bar is inserted.

7. The overcharge safety device of claim 6, wherein the portion of the guide member is inserted into the housing while passing through the housing.

8. The overcharge safety device of claim 2, wherein a contact member is mounted at the first end portion of the guide member.

9. The overcharge safety device of claim 8, wherein the contact member is inclined.

10. The overcharge safety device of claim 3, wherein a contact member is mounted at the first end portion of the guide member.

11. The overcharge safety device of claim 10, wherein the contact member is inclined.

12. The overcharge safety device of claim 1, wherein the first bonding part is soldered together with the lead tap, and wherein the second bonding part is soldered together with the bus bar.

13. The overcharge safety device of claim 1, wherein the first bonding part and the second bonding part are thinner than the switch body, and
wherein, as the pouch of the battery cell swells, the guide member breaks the first bonding part or the second bonding part.

14. An overcharge safety device comprising:
a switch electrically connecting a lead tap of a battery cell with a bus bar;
a guide member connected with the switch and movable as a pouch of the battery cell swells; and
a housing, which receives the switch and a portion of the guide member,
wherein, as the pouch of the battery cell swells, the guide member moves toward the bus bar such that the switch is disconnected from the lead tap.

15. The overcharge safety device of claim 14, wherein the housing comprises:

a first opening into which the lead tap is inserted; and
a second opening into which a connection part of the bus bar is inserted.

16. The overcharge safety device of claim 15, wherein the portion of the guide member is inserted into the housing while passing through the housing.

\* \* \* \* \*